US008939824B1

(12) United States Patent
Bash et al.

(10) Patent No.: US 8,939,824 B1
(45) Date of Patent: Jan. 27, 2015

(54) AIR MOVING DEVICE WITH A MOVABLE LOUVER

(75) Inventors: Cullen E. Bash, Los Gatos, CA (US); Chandrakant Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2403 days.

(21) Appl. No.: 11/796,947

(22) Filed: Apr. 30, 2007

(51) Int. Cl.
*H05K 7/20* (2006.01)
*H05K 5/00* (2006.01)
*F25D 17/00* (2006.01)

(52) U.S. Cl.
USPC .............................. 454/184; 361/687; 62/178

(58) Field of Classification Search
USPC ......................................................... 454/184
See application file for complete search history.

(56) References Cited

U.S. PATENT DOCUMENTS

| 5,251,814 | A | * | 10/1993 | Warashina et al. | 236/49.3 |
| 5,438,226 | A | * | 8/1995 | Kuchta | 307/125 |
| 5,815,078 | A | * | 9/1998 | Mun et al. | 340/573.1 |
| 7,531,737 | B2 | * | 5/2009 | Ide et al. | 84/645 |
| 2002/0055329 | A1 | * | 5/2002 | Storck et al. | 454/186 |
| 2003/0193777 | A1 | * | 10/2003 | Friedrich et al. | 361/687 |
| 2006/0075764 | A1 | * | 4/2006 | Bash et al. | 62/178 |
| 2011/0207391 | A1 | * | 8/2011 | Hamburgen et al. | 454/184 |

* cited by examiner

*Primary Examiner* — Steven B McAllister
*Assistant Examiner* — Helena Kosanovic
(74) *Attorney, Agent, or Firm* — Mannava Kang P.C.; Timothy Kang

(57) ABSTRACT

An air moving device includes an inlet for receiving airflow, an apparatus for cooling the received airflow, an apparatus for moving the airflow, an outlet for exhausting the cooled airflow, at least one louver positioned to direct the cooled airflow exhausted from the outlet, and a motor attached to the louver. The air moving device also includes a controller for controlling the motor to thereby vary a position of the movable louver to thereby vary a region of influence of the air moving device.

7 Claims, 7 Drawing Sheets

US 8,939,824 B1

AIR MOVING DEVICE WITH A MOVABLE LOUVER

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation. As such, the computer systems often consume a great deal of energy in performing various computing functions.

Air conditioning units are often provided to supply cooling airflow to the computer systems through a plenum and vent tiles provided in the data center. The amount of cooling airflow supplied through the vent tiles is often based upon the pressure of the cooling airflow in the plenum, as supplied by the air conditioning units. Although the pressure may differ between various areas in the plenum, the pressures in those areas often remain relatively static because each of the air conditioning units typically supplies cooling airflow to respective locations, depending upon their respective locations in the data center. As such, in areas where the pressures are relatively low, there may be an inadequate amount of cooling airflow supplied to the computer systems through vent tiles located in those areas of relatively low pressure. Inadequate supplies of cooling airflow are known to reduce performance and, in certain instances, to result in damage to the computer systems.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein is an air moving device comprising movable louvers designed to vary a direction of airflow supplied from the air moving device. The positions of the movable louvers may be varied to thereby vary a region of influence of the air moving device. Also disclosed herein are a system and a method for controlling airflow delivery in a room using one or more of the air moving devices having movable louvers.

According to a first example, the system and method may be implemented to substantially reduce or remove hotspot formations in the room. In another example, the system and method may be implemented to place workloads according to their criticalities, as determined, for instance, in a service level agreement. In a further example, the system and method may be implemented to vary the regions of influence of one or more air moving devices based upon workload placements. In a yet further example, the system and method may be implemented to vary the regions of influence of one or more air moving devices 114a-114n in response to an air moving device 114a operating improperly.

Through implementation of various aspects of the invention disclosed herein, the regions of influence of one or more air moving devices may be varied to thereby vary the availabilities and, in one regard, to increase the up-times, of electronic components contained in the various regions of influence.

Figure 1A:
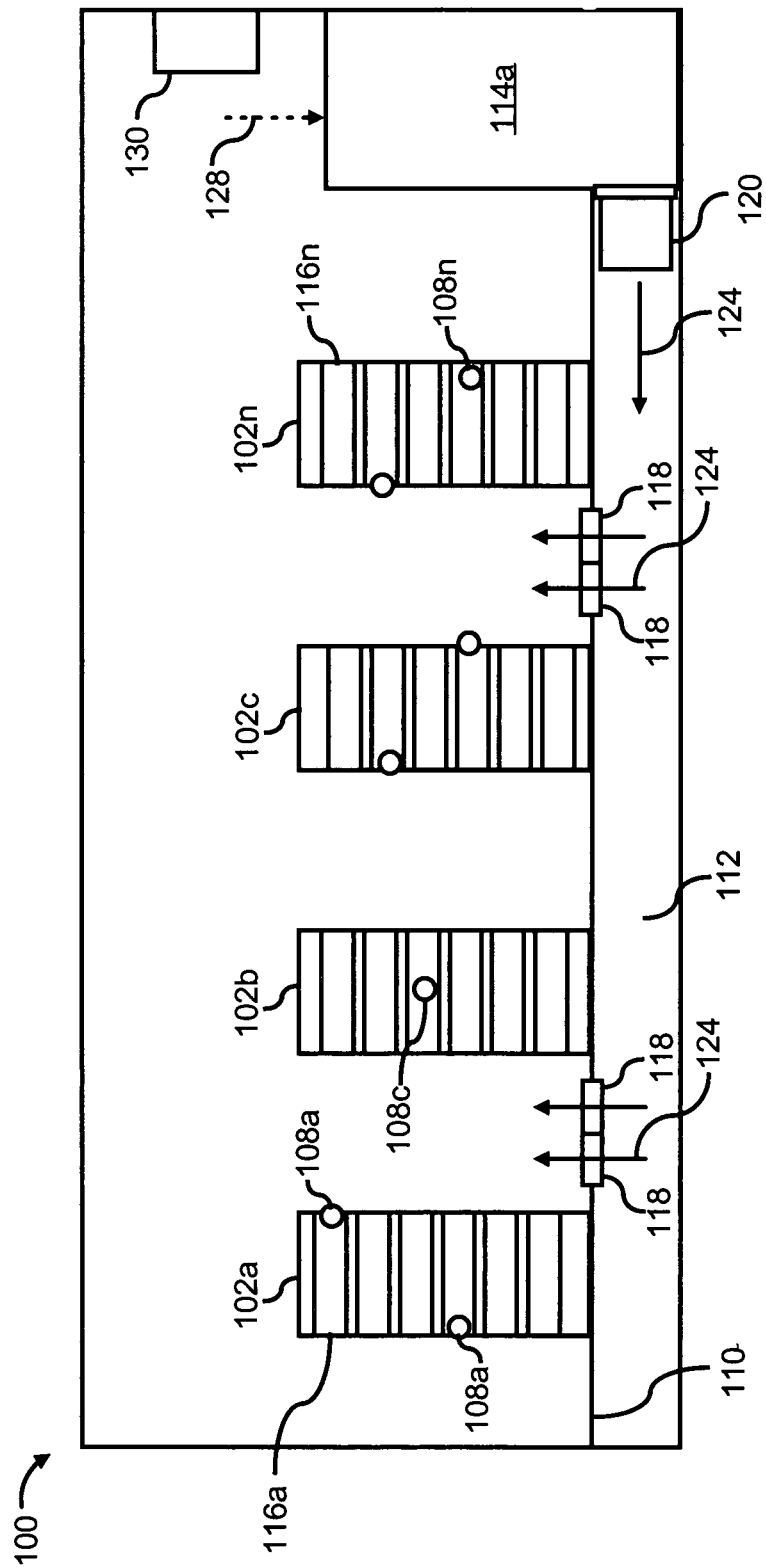
FIG. 1A shows a simplified side elevational view, in cross-section of a room, in which various examples of a system for controlling airflow delivery may be implemented, according to an embodiment of the invention.

With reference first to FIG. 1A, there is shown a simplified side elevational view, in cross-section, of a section of a room 100, such as a data center, in which various examples of a system for controlling airflow delivery may be implemented, according to an example. The terms "data center" are generally meant to denote a room or other space where one or more components capable of generating heat may be situated. In this respect, the terms "data center" are not meant to limit embodiments of the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer. The racks 102a-102n may comprise, for instance, electronics cabinets configured to house electronic components 116a-116n, for instance, computers, servers, bladed servers, disk drives, displays, switches, routers, etc. The electronic components 116a-116n may also describe the subsystems and the components may be operated to perform various electronic functions, for instance, computing, switching, routing, displaying, and the like. In this regard, the electronic components 116a-116n may also comprise, processors, memories, power supplies, etc.

The racks 102a-102n are depicted as being positioned on a raised floor 110, which may function as a plenum for delivery of cooled air from one or more air moving devices 114a-114n (only air moving device 114a is shown in FIG. 1A). The air moving devices 114a-114n, where "n" is an integer, generally operate to supply airflow into a space 112 beneath a raised floor 110, as indicated by the arrow 124, and in certain instances to cool heated air (indicated by the arrows 128). In addition, the air moving devices 114a-114n may supply the electronic components 116a-116n housed in the racks 102a-102n with airflow that has been cooled, through any reasonably suitable known manners. In this regard, the air moving devices 114a-114n may comprise vapor-compression type air conditioning units, chiller type air conditioning units, etc.

The air moving devices 114a-114n include respective cooling components (not shown) configured to manipulate characteristics of the cooled airflow supplied to the racks 102a-102n, such as, airflow temperature and supply rate. The cooling components may include, for instance, devices for manipulating airflow temperature, such as chillers, heat exchangers, etc., and devices for manipulating the supply flow rates, such as variable frequency devices, blowers, etc., of the cooled air.

The air moving devices 114a-114n also include respective movable louvers 120 configured and positioned to vary the direction in which airflow is supplied into the space 112 by the air moving devices 114a-114n. As shown in FIG. 1A, a movable louver 120 is rotatably attached to a lower portion of the air moving device 114a. The movable louver 120, more particularly, is depicted as being positioned in the space 112 formed beneath the raised floor 110. In addition, the lower portion of the air moving device 114a to which the movable louver 120 is attached is also positioned beneath the raised floor 110. In this regard, the raised floor 110 may include a plurality of openings through which the air moving devices 114a-114n may extend.

The raised floor 110 may include additional openings containing air delivery devices 118 through which the cooled air, indicated by the arrows 124, may be delivered from the space 112 to the racks 102a-102n. The air delivery devices 118 may be positioned between some or all of the racks 102a-102n. In addition, the air delivery devices 118 may comprise, for instance, ventilation tiles, variable airflow volume devices, etc.

Although the air moving devices 114a-114n have been described with respect to a raised floor 110, the air moving devices 114a-114n may be implemented in data centers 100 comprising lowered ceilings or walls containing plenums, without departing from a scope of the data center 100 described herein. In any these alternative examples, the portions of the air moving devices 114a-114n to which the movable louvers 120 are attached may extend into the plenums in manners similar to that depicted in FIG. 1A. In addition, the air delivery devices 118 may also be provided on the lower ceilings or walls.

Also depicted in FIG. 1A is a system manager 130 configured to control various operations in the data center 100, such as, cooling provisioning, workload placement, etc. Although the system manager 130 is illustrated in FIG. 1A as comprising an element separate from the electronic components 116a-116n, the system manager 130 may comprise one or more of the electronic components 116a-116n without departing from a scope of the data center 100 disclosed herein. In addition, or alternatively, the system manager 130 may comprise software configured to operate on a computing device, for instance, one of the electronic components 116a-116n or a separate computing device. In any regard, various manners in which the system manager 130 may control the delivery of airflow in the data center 100 are described in greater detail herein below.

In one example, a plurality of environmental condition sensors 108a-108n may be positioned at various locations of or throughout the data center 100. The environmental condition sensors 108a-108n may be designed, for instance, to detect at least one environmental condition, such as, temperature, humidity, pressure, airflow velocity, airflow magnitude, etc., and to convey the detected condition information to the system manager 130. The environmental condition sensors 108a-108n have been graphically depicted as being positioned at a relatively small number of locations, it should, however, be understood that any reasonably suitable number of sensors 108a-108n may be employed in the data center 100. In addition, the sensors 108a-108n may comprise sensors equipped with the electronic components 116a-116n or they comprise separately attached sensors. In addition, the sensors 108a-108n may be configured to convey the detected condition information through any suitable wired or wireless means.

As described in greater detail herein below, the system manager 130 may control the movable louvers 120 to controllably vary the direction in which airflow supplied by the air moving devices 114a-114n is supplied in the data center 100. In one example, the system manger 130 may control the movable louvers 120 based upon the conditions detected by one or more of the sensors 108a-108n. In this example, the system manager 130 may, for instance, determine an area, such as, a hotspot, in the data center 100 that is receiving cooling airflow at a relatively lower than desired rate as identified by the conditions detected by one or more of the sensors 108a-108n. In addition, the system manager 130 may control the movable louvers 120 of one or more air moving devices 114a-114n to vary the respective regions of influence of the one or more air moving devices 114a-114n and thus vary the locations of magnitudes of airflow supplied to various locations in the data center 100. Varying of the airflow, such as, by increasing the magnitude of cooling airflow supplied to the hotspot location may reduce its temperature, thereby removing the hotspot.

As another example, and in addition or alternatively to the example above, the system manager 130 may control the placement of workloads onto various electronic components 116a-116n based upon, for instance, the directions in which the airflows from the air moving devices 114a-114n flow. The system manager 130 may also control the regions of influence of one or more of the air moving devices 114a-114n based upon the locations of the workload placements.

By way of example, the system manager 130 may cause the louvers 120 of two air moving devices 114a-114n to deliver air to a particular set of racks 102a and 102b. In this example, the electronic components 116a-116n contained in the racks 102a and 102b may be considered as having greater uptime and redundancy since they are cooled by two air moving devices 114a and 114b, instead of a single air moving device 114a. More particularly, for instance, if one of the air moving devices 114a malfunctions or is redirected to supply a different area of the data center 100 with cooling airflow, the electronic components 116a-116n in the racks 102a and 102b will still receive cooling airflow from the other air moving device 114b. It should be understood that the louvers 120 of more than two air moving devices 114a and 114b may be positioned to supply airflow to a particular area, without departing from a scope of the data center 100, to thereby provide greater levels of redundancy.

As a further example, and in addition or alternatively to the examples discussed above, the system manager 130 may control either or both of, the movable louvers 120 to vary the regions of influence of one or more air moving devices 114a-114n, and the placement of workloads onto various electronic components 116a-116n based upon, for instance, a determination that one or more of the air moving devices 114a-114n has malfunctioned.

Figure 1B:
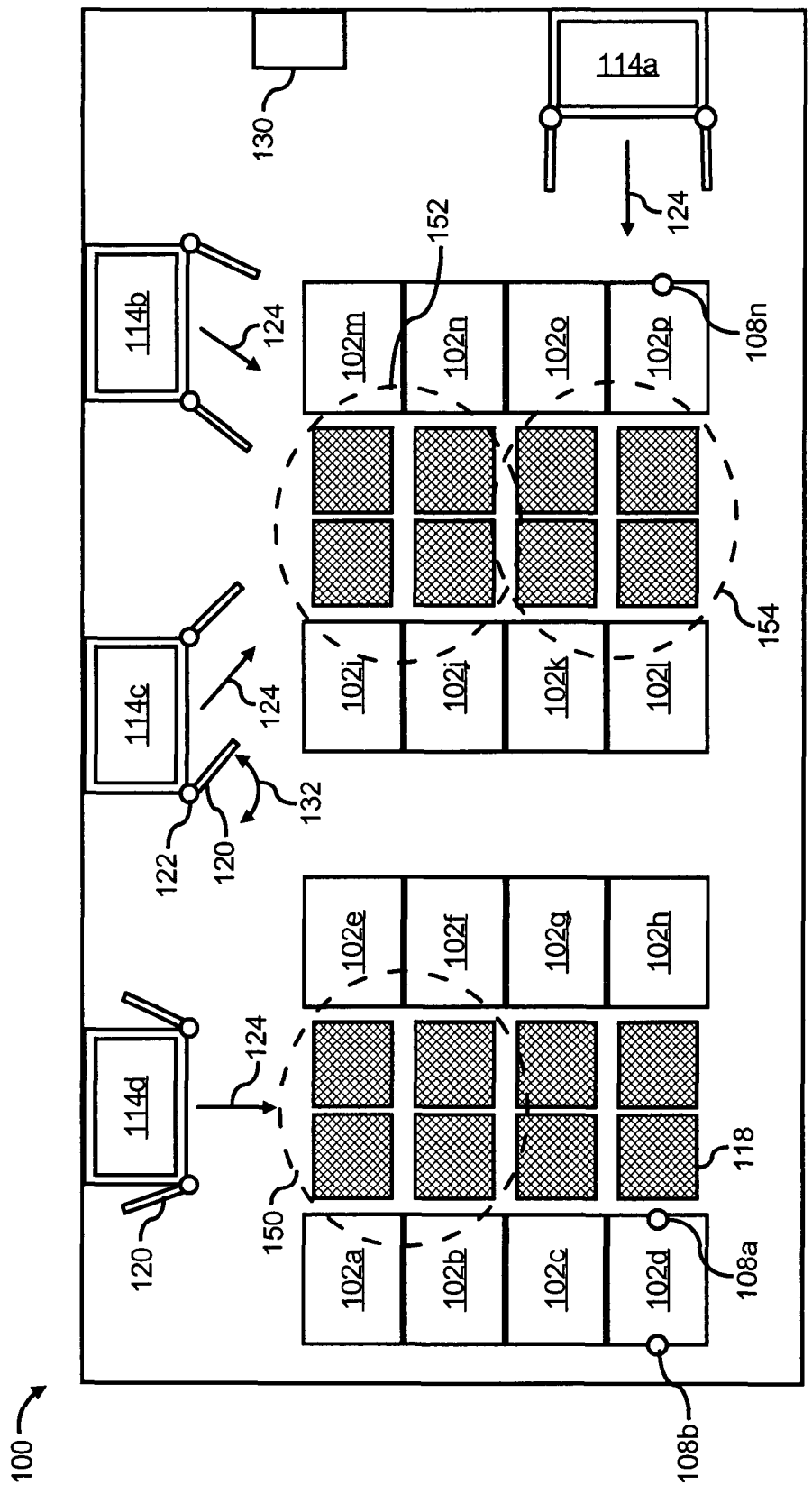
FIG. 1B shows a simplified top plan view, partially in cross-section, of part of the room depicted in FIG. 1A, according to an embodiment of the invention.

With reference now to FIG. 1B, there is shown a simplified top plan view, partially in cross-section, of part of the data center 100 depicted in FIG. 1A, according to an example. In FIG. 1B, the raised floor 110 has been removed to more clearly show the louvers 120 attached to the bottom sections of the air moving devices 114a-114n (only air moving devices 114a-114d are shown). It should, thus, be understood that the racks 102a-102 may be supported on and that the air delivery devices 118 are provided in openings formed in the raised floor 110.

As shown in FIG. 1B, each of the air moving devices 114a-114n are equipped with pairs of movable louvers 120. However, the air moving devices 114a-114n may be equipped with one or more louvers 120 without departing from a scope of the air moving devices 114a-114n disclosed herein. In any event, the movable louvers 120 are depicted as being rotatably attached to their respective air moving devices 114a-114n through attachment members 122, which may comprise hinge structures. The attachment members 122 generally enable the movable louvers 120 to rotate about an axis of the attachment members 122 as denoted by the arrow 132.

In one example, the attachment members 122 may be configured to enable the movable louvers 120 to be manually repositionable. In this example, the attachment members 122 may include, for instance, devices that maintain the louvers 120 at set angles once they have been positioned by a user. These devices may include springs, dampers, or other mechanical apparatuses having sufficient strength to substantially maintain the louvers 120 in their set positions as airflow exhausted from the air moving devices 114a-114n pushes against the louvers 120.

In another example, the attachment members 122 may be connected to or may comprise actuators, such as motors, or the like, configured to automatically rotate the louvers 120. In this example, the angles at which the louvers 120 are respectively positioned to direct airflow may be controlled according to one or more operating programs. As discussed in greater detail herein below, the one or more operating programs may be configured to vary airflow directionality either proactively or reactively with regard to various conditions in the data center 100.

In either example, the directions in which the louvers 120 face generally dictate the region of influence for their respective air moving devices 114a-114n. The region of influence of a particular air moving device 114a may be considered as an area in the data center 100 where the air moving device 114a has at least a predetermined level of influence. The region of influence of each of the air moving devices 114a-114n may be determined, for instance, through any reasonably suitable manner, such as, through testing of various louver 120 positions and their effects, such as, temperature, airflow velocity, magnitude, etc., on various locations of the data center 100.

According to an example, the regions of influence may be determined in any of the manners disclosed in U.S. Pat. No. 7,117,129, entitled "Commissioning of Sensors", which names Cullen E. Bash et al., as the inventors, the disclosure of which is hereby incorporated by reference in its entirety. In addition, the regions of influence of the air moving devices 114a-114n may change as the direction of airflow supplied by the air moving devices 114a-114n are varied. The system manager 130 may thus determine a plurality of different regions of influence for each of the air moving devices 114a-114n at the different louver 120 positions to thereby predict how changes in the positions of the louvers 120 affect conditions at various locations in the data center 100.

By way of example, the region of influence of the air moving device 114d may be considered as including the air delivery devices 118 located within the dashed circle labeled 150. In addition, the region of influence of the air moving device 114b may be considered as including the air delivery devices 118 located within the dashed circle labeled 152. Likewise, the region of influence of the air moving device 114c may be considered as including the air delivery devices 118 located within the dashed circle labeled 152 because the louvers 120 of the air moving device 114c are positioned to cause the airflow, as indicated by the arrow 124, to be directed toward the dashed circle labeled 152. However, if the louvers 120 of the air moving device 114c were rotated clockwise toward the rack 102a, the region of influence of the air moving device 114c may be considered as including the air delivery devices 118 located within the dashed circle labeled 150.

The respective regions of influence may also be extended out to respective ones of the racks 102a-102n and the electronic components 116a-116n. For instance, the levels of influence each of the air moving devices 114a-114n has over respective ones of the electronic components 116a-116n may also be determined, such that, the electronic components 116a-116n over which each of the air moving devices 114a-114n has at least a predetermined level of influence may be determined. In one example, the sensors 108a-108n associated with either or both of the racks 102a-102n and the electronic components 116a-116n may be employed to determine how varying conditions of airflow supplied by the respective air moving devices 114a-114n affect the airflow conditions around the respective racks 102a-102n and electronic components 116a-116n.

In addition, or alternatively, the respective regions of influence may be extended out to respective ones of either or both of the racks 102a-102n and the electronic components 116a-116n based upon correlations between the air delivery devices 118 and the racks 102a-102n/electronic components 116a-116n. For instance, the air delivery device 118 located adjacent to the rack 102a may be associated with the rack 102a, and the electronic components 116a-116n contained therein, because airflow delivered from that air delivery device 118 may be known to have at least a predetermined level of influence over the conditions in the rack 102a, and the electronic components 116a-116n contained therein.

In any respect, in the configuration shown in FIG. 1B, the electronic components 116a-116n associated with the air delivery devices 118 located in the dashed circle labeled 152 may be considered as having higher levels of availability than the electronic components 116a-116n associated with the air delivery devices 118 located in the dashed circle labeled 150. One reason for the increased level of availability is that the electronic components 116a-116n associated with the air delivery devices 118 located in the dashed circle labeled 152 are configured to receive cooling airflow from two air moving devices 114b and 114c. However, the electronic components 116a-116n having higher levels of availability may be varied, for instance, by rotating the louvers 120 of the air moving device 114c toward the rack 102a. In this instance, the electronic components 116a-116n associated with the air delivery devices 118 located in the dashed circle labeled 150 may be considered as having the relatively higher level of availability.

Similarly, in the configuration shown in FIG. 1B, the electronic components 116a-116n associated with the air delivery devices 118 located in the dashed circle labeled 150 may be considered as having a relatively lower level of availability because those electronic components 116a-116n are configured to receive cooling airflow from both air moving devices 114b and 114c. In addition, the electronic components 116a-116n associated with the air delivery devices 118 located in the dashed circle 154 may be considered as having an intermediate level of availability because they may receive a majority of their airflow from the air moving device 114a, but may also receive partial amounts of airflow from one or both of the air moving devices 114b and 114c.

Figure 2A:
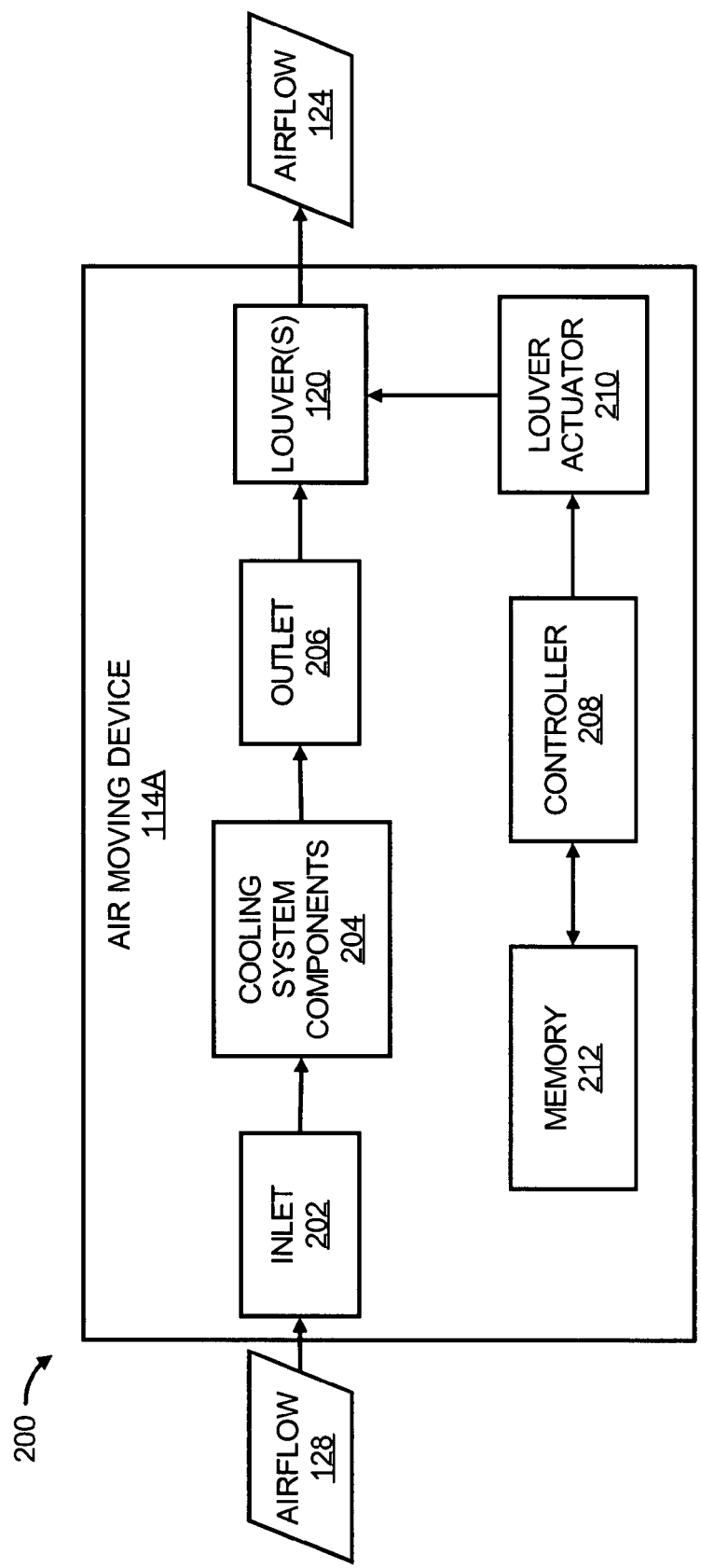
FIG. 2A shows a block diagram of an air moving device comprising at least one louver, according to an embodiment of the invention.

With reference now to FIG. 2A, there is shown a block diagram 200 of an air moving device 114a having at least one louver 120, according to an example. It should be understood that the following description of the block diagram is but one manner of a variety of different manners in which such an air moving device 114a may be configured. In addition, it should be understood that the air moving device 114a may include additional components and that some of the components described herein may be removed and/or modified without departing from a scope of the air moving device 114a.

As shown in FIG. 2A, the air moving device 114a depicted in FIGS. 1A and 1B is configured to receive heated airflow 128, to cool the heated airflow, and to supply the cooled airflow 124, while controlling the direction in which the cooled airflow 124 is supplied from the air moving device 114a. More particularly, the air moving device 114a receives the heated airflow 128 through an inlet 202 of the air moving device 114a, the heated airflow 128 is cooled by one or more cooling system components 204, and the cooled airflow 124 is exhausted from the air moving device 114a through an outlet 206. The cooling system components 204 may comprise any reasonably suitable apparatuses, such as, heat exchangers, chillers, pumps, humidifiers, etc., configured to vary a characteristic of the airflow flowing through the air moving device 114a.

Also depicted in FIG. 2A are a controller 208 and a louver actuator 210. According to an example, the controller 208 is configured to operate the louver actuator 210, which may comprise a motor, or other suitable actuator, to vary the angle or position of the at least one louver 120 and thereby vary the direction in which the airflow 124 is supplied from the air moving device 114a. The controller 208 may cause the louver 120 angle or position to be varied for a number of different reasons as discussed in greater detail herein below.

In any regard, the controller 208 may comprise a computing device, such as, a microprocessor, a micro-controller, an application specific integrated circuit (ASIC), and the like, configured to perform various processing functions. In addition, or alternatively, the controller 208 may comprise software stored on a data storage device. In either event, the controller 208 may form part of or may be stored in a memory 212 of the air moving device 114a.

The memory 212 may also be configured to store software or algorithms that provide the functionality of the controller 208. In this regard, the memory 208 may comprise, for instance, volatile or non-volatile memory, such as DRAM, EEPROM, MRAM, flash memory, floppy disk, a CD-ROM, a DVD-ROM, or other optical or magnetic media, and the like.

Although not shown, the controller 208 may also be configured to control the cooling system components 204, to thereby, vary a characteristic, such as, temperature, volume flow rate, humidity, etc., of the airflow supplied by the air moving device 114a. Alternatively, however, the cooling system components 204 may be configured to operate without intervention from the controller 208. In this example, the cooling system components 204 may be configured to vary their operations based upon, for instance, changes in the temperature of the airflow received through the inlet 202.

In addition, although the controller 208 and the memory 212 have been depicted and described as forming part of the air moving device 114a, it should be understood that either or both of the controller 208 and the memory 212 may be located outside of the air moving device 114a without departing from a scope of the air moving device 114 described herein. An example of a controller 208 located outside of the air moving device 114a is depicted in FIG. 2B.

Figure 2B:
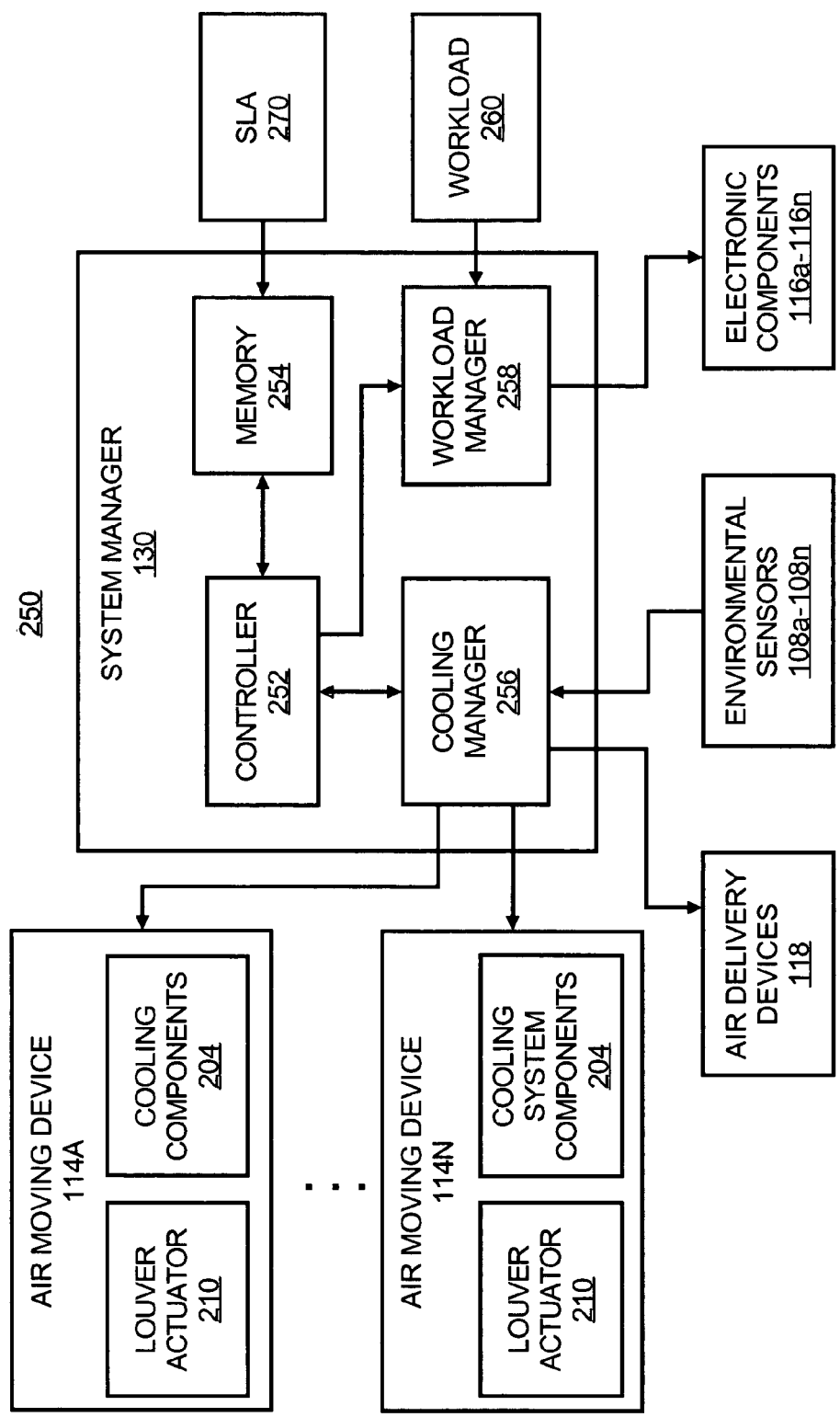
FIG. 2B shows a block diagram of a system for controlling airflow delivery in a room, according to an embodiment of the invention.

FIG. 2B, more particularly, depicts a block diagram of a system 250 for controlling airflow delivery in a room 100, according to an example. It should be understood that the following description of the block diagram is but one manner of a variety of different manners in which such an airflow control system 250 may be configured. In addition, it should be understood that the air moving device 114a may include additional components and that some of the components described herein may be removed and/or modified without departing from a scope of the airflow control system 250.

As shown in FIG. 2B, the system manager 130 includes a controller 252 configured to control a cooling manager 252 and a workload manager 254. In one example, the system manager 130 comprises a computing device and the controller 252 comprises a microprocessor, a micro-controller, an application specific integrated circuit (ASIC), and the like, configured to perform various processing functions of the system manager 130. In addition, or alternatively, the controller 252 may comprise software stored on a memory 254.

The memory 254 may also be configured to store software or algorithms that provide the functionality of the controller 252. In this regard, the memory 254 may comprise, for instance, volatile or non-volatile memory, such as DRAM, EEPROM, MRAM, flash memory, floppy disk, a CD-ROM, a DVD-ROM, or other optical or magnetic media, and the like.

The controller 252 is also configured to invoke or implement a cooling manager 256 to control one or more of the air moving devices 114a-114n. Generally speaking, the cooling manager 256 comprises software, hardware, or a combination thereof designed to control various operations of the air moving device(s) 114a-114n. In one regard, the controller 252 may invoke or implement the cooling manager 256 to control the louver actuator(s) 210 to thereby vary the position or angle of the louvers 120 of one or more air moving devices 114a-114n to thereby vary the distribution of airflow supplied by the one or more air moving devices 114a-114n in the data center 100. The controller 252 may also invoke or implement the cooling manager 256 to control the operations of one or more of the air delivery devices 118.

In addition, the controller 252 may invoke or implement the cooling manager 256 to control the operations of the cooling system components 204, as described above. As also described above, however, the cooling system components 204 may operate without intervention from the controller 252.

The controller 252 is further configured to invoke or implement a workload manager 258. The workload manager 258 comprises software, hardware, or a combination thereof designed to receive workloads 260, which may be in the form of web requests, data analysis, multimedia rendering, or other types of applications. The workload manager 258 may also be designed to determine which of the electronic components 116a-116n comprise suitable configurations for performing the workloads 260. In addition, or alternatively, the workload manager 320 may determine which of those electronic components 116a-116n have sufficient capacities to perform the workloads 260. In any case, the workload manager 258 may assign the workload 260 to the selected one or more electronic components 116a-116n. However, prior to assigning the workload 260, the controller 252 may communicate instructions to the workload manager 258 to assign the workload 260 according to one or more control policies as described in greater detail herein below.

In one regard, the controller 252 is configured to invoke or implement the workload manager 258 to determine one or more of the requirements of the workload 260, the requirements of a service level agreement (SLA) 270 pertaining to the workload 260, the cooling requirements to perform the workload 260, the electronic components 116a-116n capable of performing the workload 260, etc., in placing the workload 260 among one or more electronic components 116a-116n.

According to an example, the SLA 270 may define the criticalities of various workloads 260, the levels of redundancy desired for performance of the various workloads 260, the availabilities of the electronic components 116a-116n configured to perform the workloads 260, etc. In addition, or alternatively, the SLA 270 may set various other conditions, such as, the number of electronic components 116a-116n that are to be devoted to performing particular workloads 260, the times by which particular workloads 260 are to be completed, etc. In any regard, the provisions or conditions of the SLA 270 may be stored in the memory 254.

The controller 252 may access the SLA 270 provisions in determining which of the electronic components 116a-116n are to perform the workloads 260. In addition, or alternatively, the controller 252 may access the SLA 270 provisions in determining how the louver actuators 210 are to be controlled to vary airflow delivery to the electronic components 116a-116n. The controller 252 may, moreover, vary operations of one or more of the cooling system components 204 based upon the workload 260 placements.

Figure 4:
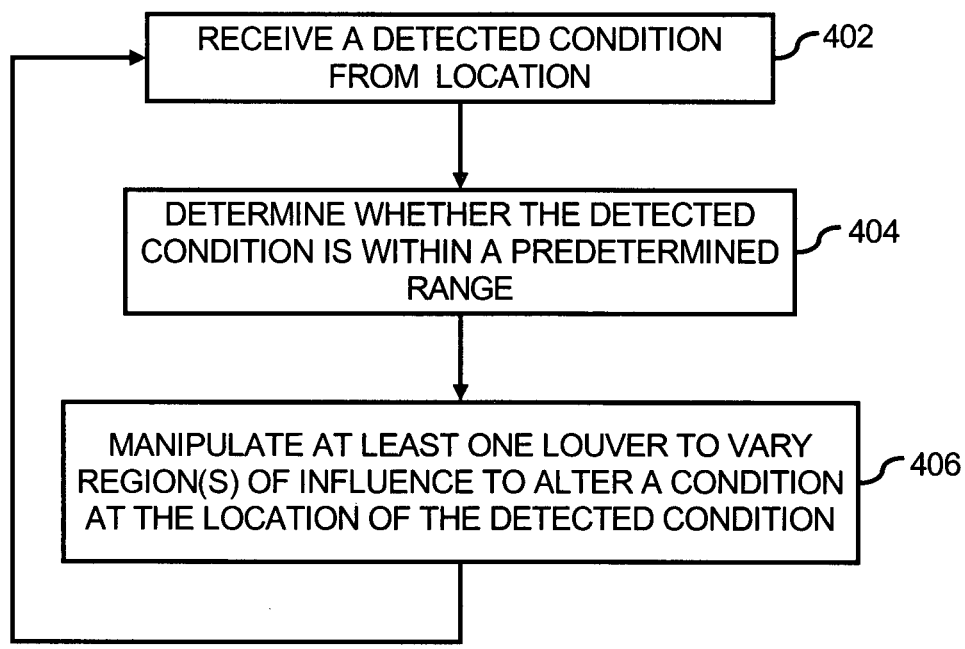
FIG. 4 shows a flow diagram of a method for controlling airflow delivery in a room, according to an embodiment of the invention.
Figure 5:
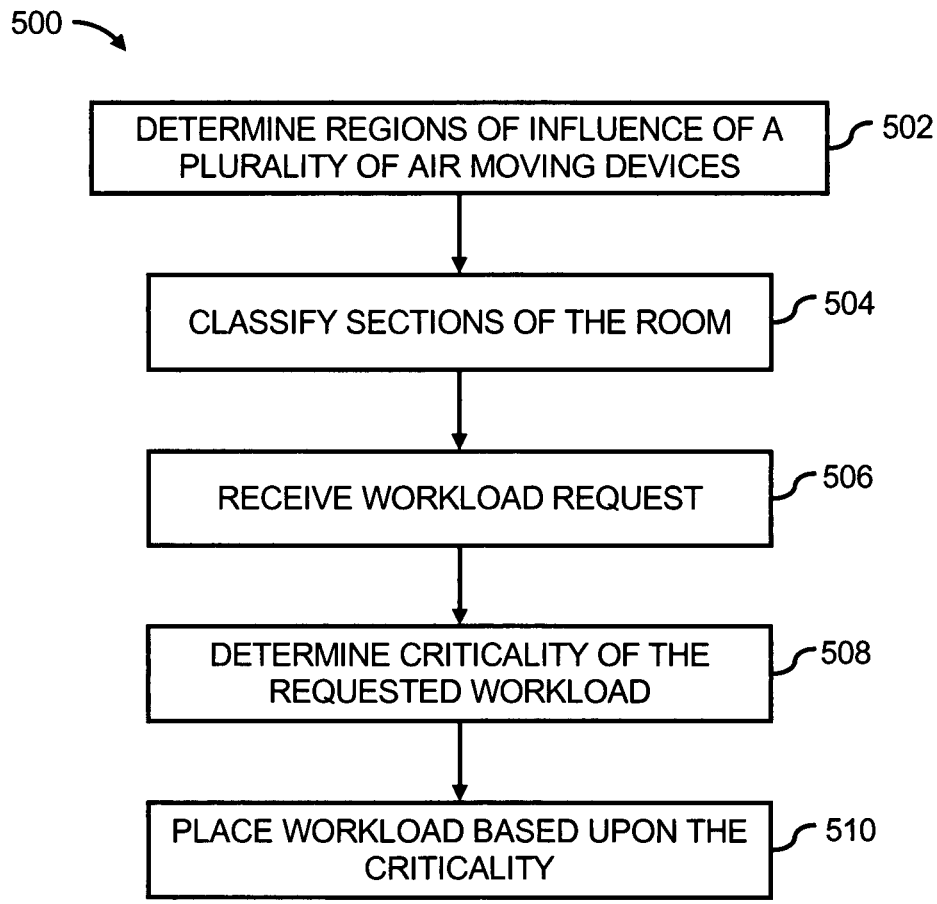
FIG. 5 shows a flow diagram of a method for controlling workload placement in a room, according to an embodiment of the invention.
Figure 6:
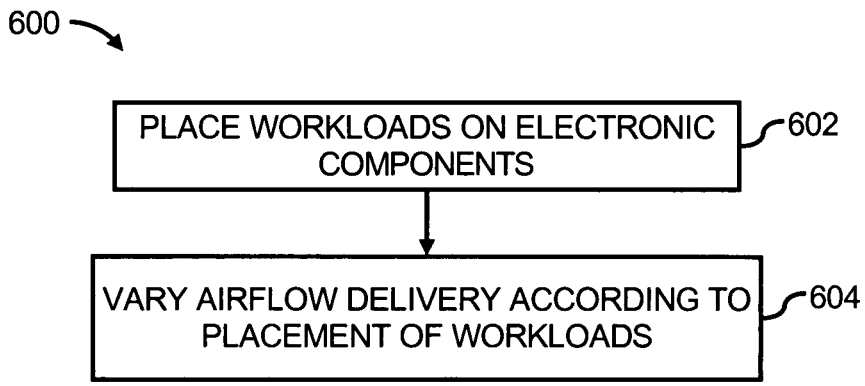
FIG. 6 shows a flow diagram of a method for controlling airflow delivery in a room, according to another embodiment of the invention.

In any regard, various operations of the components forming the airflow delivery system 250 are described in greater detail with respect to the following figures. In the following figures, FIG. 3 provides a relatively broad overview of the operations performed by the airflow delivery system 250 and FIGS. 4-6 provide relatively more detailed operations.

Figure 3:
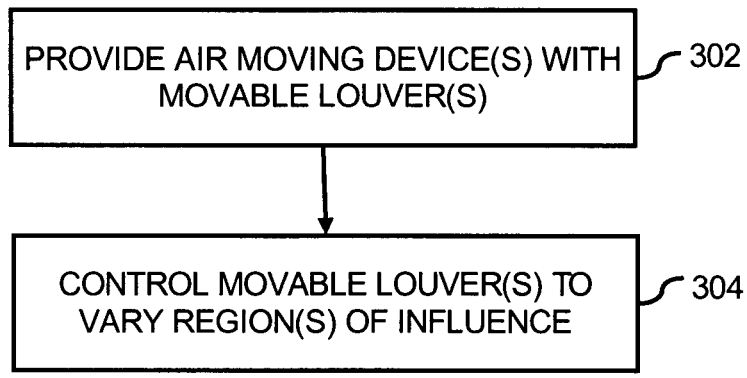
FIG. 3 shows a flow diagram of a method for controlling airflow delivery in a room, according to an embodiment of the invention.

With reference first to FIG. 3, there is shown a flow diagram of a method 300 for controlling airflow delivery in a data center 100, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

The description of the method 300 is made with reference to the air moving device 114a depicted in FIG. 2A and the airflow delivery system 250 depicted in FIG. 2B, and thus makes reference to the elements cited therein. It should, however, be understood that the method 300 is not limited to the elements set forth in the air moving device 114a and the airflow delivery system 250. Instead, it should be understood that the method 300 may be practiced by a system having a different configuration than those set forth in the air moving device 114a and the airflow delivery system 250.

Generally speaking, the method 300 may be implemented by either or both of the controller 208 and the system manager 130 to control airflow delivery in a data center 100. The controller 208 and/or system manager 130 may implement the method 300 to vary the regions of influence of one or more air moving devices 114a-114n and thereby vary the delivery of airflow in the data center 100.

As an initial step, one or more air moving devices 114a-114n may be provided in the data center 100 as indicated at step 302. More particularly, for instance, the air moving device(s) 114a-114n may be provided as shown in FIGS. 1A and 1B, such that, the outlets 206 and the louvers 120 of the air moving device(s) 114a-114n are positioned within a space 112 configured as a plenum for delivering cooled airflow to the air delivery devices 118.

In addition, at step 304, the controller 208, 252 may control the movable louver(s) 120 of the air moving device(s) 114a-114n to vary the region(s) of influence of the air moving device(s) 114a-114n. In one example, the controller 208, 252 may implement step 304 to substantially reduce or remove hotspot formations in the data center 100. In another example, the controller 208, 252 may implement step 304 to place workloads 260 according to their criticalities, as determined, for instance, in an SLA 270. In a further example, the controller 208, 252 may implement step 304 to vary the regions of influence of one or more air moving devices 114a-114n based upon workload 260 placements. In a yet further example, the controller 208, 252 may implement step 304 to vary the regions of influence of one or more air moving devices 114a-114n in response to an air moving device 114a operating improperly.

At step 304, the controller 208, 252 may also vary at least one of an opening and a direction of airflow exhausted from at least one of the air delivery devices 118 to further vary the region of influence of at least one air moving device 114a-114n. More particularly, for instance, an air delivery device 118 may be in a substantially closed position to thereby reduce the influence an air moving device 114a has over a particular section, such as a rack 102a, in the data center 100.

The various examples of step 304 are described in greater detail with respect to the following flow diagrams. Although each of the various examples is described separately, it should be understood that the steps outlined in one or more of the following flow diagrams may be combined. Thus, for instance, the controller 208, 252 may place workloads on various electronic components 116a-116n according to their criticalities while also varying regions of influence in response to an air moving device 114a operating improperly.

With reference first to FIG. 4, there is shown a flow diagram of a method 400 for controlling airflow delivery in a data center 100, according to an example. The method 400 may be considered as providing a more detailed illustration of step 304 in FIG. 3. More particularly, the method 400 depicts an example where the controller 208, 252 implements step 304 to substantially reduce or remove hotspot formations in the data center 100.

As shown in FIG. 4, the controller 208, 252 may receive a detected condition, such as, temperature, airflow magnitude, airflow velocity, etc., from at least one sensor 108a-108n. The controller 208, 252 may determine a location of the at least one sensor 108a-108n by, for instance, accessing a look-up table that correlates an identification of the at least one sensor 108a-108n with its location in the data center 100. The look-up table may have been developed prior to performance of the methods 300 and 400.

In any regard, the controller 208, 252 may determine whether the detected condition is within a predetermined range, at step 404. By way of example, if the detected condition is temperature, the controller 208, 252 may determine whether the detected temperature is within a predetermined temperature range, which may comprise, for instance, a suitable range of temperatures in which the electronic components 116a-116n are designed to operate. As another example, if the detected condition is airflow volume flow rate, the predetermined volume flow rate may comprise, for instance, a suitable range of volume flow rates that are known to provide sufficient cooling airflow to the electronic components 116a-116n.

In any regard, at step 406, the controller 208, 252 may manipulate at least one louver 120 to vary region(s) of influence of the air moving device(s) 114a-114n and thereby alter a condition at the location of the detected condition in response to the detected condition being outside of the predetermined range. By way of example, if the temperature detected by the sensor 108a is above the predetermined range and the sensor 108a is not currently in the region of influence of an air moving device 114a, the controller 208, 252 may change the angle or position of the louvers 120 of the air moving device 114a, such that, the sensor 108a is now within the region of influence of the air moving device 114a. As such, the amount of airflow supplied to the location of the sensor 108a may be increased and/or the temperature of the airflow supplied to that location may be decreased, to thereby reduce the temperature of the airflow at the sensor 108a.

In addition, the controller 208, 252 may repeat steps 402-406 to continually monitor and vary the airflow conditions in the data center 100, 100'.

With reference now to FIG. 5, there is shown a flow diagram of a method 500 for controlling workload placement in a data center 100, according to an example. The method 500 may be performed, for instance, following implementation of step 304 in FIG. 3. More particularly, the method 500 depicts an example where the controller 208, 252 implements step 304 to vary airflow delivery in the data center 100 and then implements the method 500 to place workloads among a plurality of variously placed electronic components 116a-116n depending upon the airflow delivery conditions in the data center 100.

At step 502, the controller 208, 252 may determine regions of influence of a plurality of air moving devices 114a-114n in various manners as described above with respect to FIG. 1B. As discussed above, the regions of influence may vary depending upon the directions in which the louvers 120 of the air moving devices 114a-114n are facing when the regions of influence are determined. As such, for instance, the correlations between the louver 120 positions and the respective regions of influence may be stored in the memory 254, such that, the controller 208, 252 may relatively quickly determine the regions of influence for a given louver 120 setting.

In any regard, at step 504, the controller 208, 252 may classify various sections of the data center 100 into a plurality of different classes depending upon the levels of availability of the electronic components 116a-116n in each of the various sections. That is, those sections in the data center 100 having greater levels of cooling redundancy, for instance, those sections currently receiving cooling airflow from a pluralityy of air moving devices 114a-114n, may be classified into a first class. In addition, those sections having lesser levels of cooling redundancy, for instance, those sections currently receiving cooling airflow from a single air moving device 114a, may be classified into a second class.

At step 506, the controller 208, 252 may receive a workload request through the workload manager 258. In addition, the controller 208, 252 may determine a criticality of the requested workload, as indicated at step 508. In one example, the criticality of the requested workload may be determined based upon the provisions set forth in an SLA 270. Thus, for instance, if the SLA 270 indicates that the workload 260 is a substantially critical workload, the controller 208, 252 may invoke or implement the workload manager 258 to place the workload on one or more electronic components 116a-116n located in the first class of sections, having the higher level of availability. Likewise, if the SLA 270 indicates that the workload 260 is relatively less critical, the controller 208, 252 may invoke or implement the workload manager 258 to place the workload on one or more electronic components 116a-116n located in the second class of sections, having the higher level of availability.

In this regard, the controller 208, 252 may place the workload at step 510 according to the criticality of the workload. In addition, the controller 208, 252 may repeat steps 506-510 to place workloads 260 according to their criticalities. The controller 208, 252 may, moreover, repeat steps 502 and 504 when, for instance, the regions of influence of the plurality of air moving devices 114a-114n have not been previously determined for various louver 120 positions.

With reference now to FIG. 6, there is shown a flow diagram of a method 600 for controlling airflow delivery in a data center 100, according to an example. The method 600 may be performed, for instance, prior to and during implementation of step 304 in FIG. 3. More particularly, the method 600 depicts an example where the controller 208, 252 places workloads 260 on the electronic components 116a-116n and implements step 304 to vary airflow delivery based upon the placement of the workloads 260.

At step 602, the controller 202, 258 may invoke or implement the workload manager 258 to place a plurality of workloads 260 on a plurality of electronic components 116a-116n. The determination of which of the electronic components 116a-116n the plurality of workloads 260 are placed may be based upon, for instance, the abilities of the electronic components 116a-116n to perform the given workloads, the available capacities in the electronic components 116a-116n, etc. Alternatively, however, the workloads 260 may be placed among the plurality of electronic components 116a-116n in a substantially random fashion.

At step 604, the controller 208, 252 may invoke or implement the cooling manager 256 to control one or more of the louvers 120 to vary region(s) of influence of the air moving device(s) 114a-114n based upon the placement of the workload 260. By way of example, the controller 208, 252 may determine that a relatively large amount of workload 260 has been placed on the servers 116a-116n of a rack 102a. Thus, at step 604, the controller 208, 252 may cause the louvers 120 of the air moving device 114c to rotate from the position shown in FIG. 1B, toward the rack 102a, at step 604. In this regard, the servers 116a-116n may receive additional cooling airflow and the availability of the servers 116a-116n may be increased.

In addition, the controller 208, 252 may repeat steps 602 and 604 to continually monitor and vary the airflow conditions in the data center 100 as the workloads 260 performed by the electronic components 114a-114n varies.

The operations set forth in the methods 300, 400, 500, and 600 may be contained as at least one utility, program, or subprogram, in any desired computer accessible medium. In addition, the methods 300, 400, 500, and 600 may be embodied by a computer program, which may exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 7:
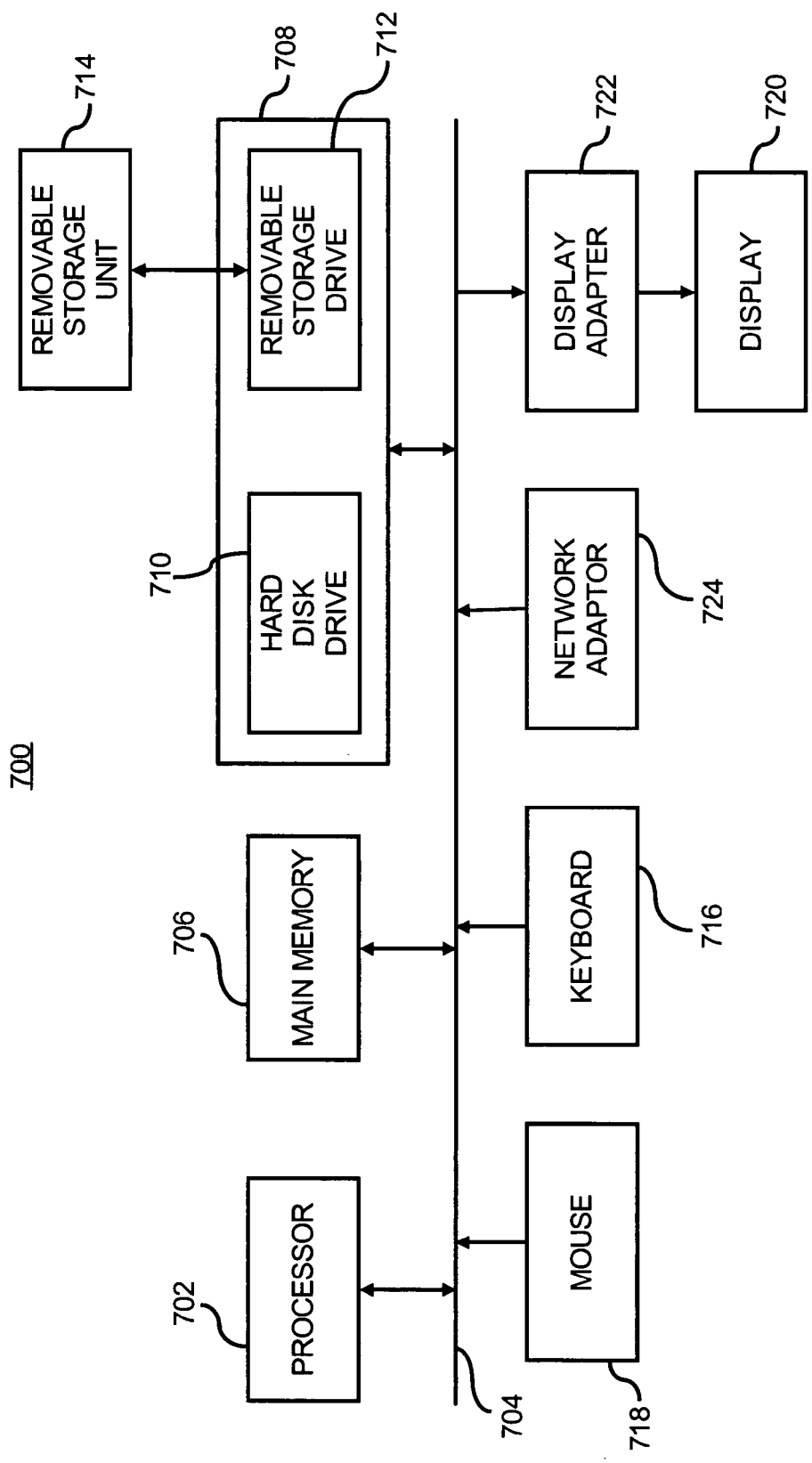
FIG. 7 illustrates a computer system, which may be employed to perform various functions described herein, according to an embodiment of the invention.

FIG. 7 illustrates a computer system 700, which may be employed to perform the various functions of system manager 130 described herein above, according to an example. In this respect, the computer system 700 may be used as a platform for executing one or more of the functions described hereinabove with respect to the system manager 130.

The computer system 700 includes a processor 702, which may be used to execute some or all of the steps described in the methods 300, 400, 500, and 600. Commands and data from the processor 702 are communicated over a communication bus 704. The computer system 700 also includes a main memory 706, such as a random access memory (RAM), where the program code for, for instance, the system manager 130, may be executed during runtime, and a secondary memory 708. The secondary memory 708 includes, for example, one or more hard disk drives 710 and/or a removable storage drive 712, representing a floppy diskette drive, a magnetic tape drive, a compact disk drive, etc., where a copy of the program code for varying airflow delivery in a data center may be stored.

The removable storage drive 710 reads from and/or writes to a removable storage unit 714 in a well-known manner. User input and output devices may include a keyboard 716, a mouse 718, and a display 720. A display adaptor 722 may interface with the communication bus 704 and the display 720 and may receive display data from the processor 702 and convert the display data into display commands for the display 720. In addition, the processor 702 may communicate over a network, for instance, the Internet, LAN, etc., through a network adaptor 724.

It will be apparent to one of ordinary skill in the art that other known electronic components may be added or substituted in the computer system 700. In addition, the computer system 700 may include a system board or blade used in a rack in a data center, a conventional "white box" server or computing device, etc. Also, one or more of the components in FIG. 7 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. An air moving device comprising:
an inlet to receive airflow;
a cooling apparatus to cool the received airflow;
a moving apparatus to move the airflow;
an outlet to exhaust the cooled airflow;
at least one louver positioned to direct the cooled airflow exhausted from the outlet;
a motor attached to the louver; and
a controller to control the motor to vary a position of the movable louver and vary a region of influence of the air moving device, wherein the controller is further to control placement of workloads among a plurality of electronic components in a room wherein the air moving device is for use in a room having a plenum, and wherein the air moving device is further to extend into the plenum such that the at least one movable louver is positioned within the plenum to direct cooled airflow into various directions in the plenum and thereby vary the region of influence og the air moving device.

2. The air moving device according to claim 1, further comprising a plurality of movable louvers.

3. The air moving device according to claim 1, wherein the controller is to control the motor to position the movable louver to cause the region of influence of the air moving device to include a subset of the plurality of electronic components and to control placement of the workloads by placing the workloads on the subset of the plurality of electronic components.

4. The air moving device according to claim 1, wherein the controller is further to vary the region of influence in response to a change in an environmental condition in the room.

5. The air moving device according to claim 1, wherein the controller is to place the workloads on a subset of the plurality of electronic components and to vary the region of influence of the air moving device to supply cooled airflow to the subset of the plurality of electronic components.

6. The air moving device according to claim 1, wherein the controller is to vary the region of influence of the air moving device prior to a change in workload placement among the plurality of electronic components in the room.

7. The air moving device according to claim 1, wherein the controller is to vary the region of influence of the air moving device in response to another air moving device malfunctioning.

* * * * *